US006581123B1

(12) United States Patent
Pua

(10) Patent No.: US 6,581,123 B1
(45) Date of Patent: Jun. 17, 2003

(54) INTERFACE OF HARD DISCS BODY DEVICE FOR HOT SWAP MEMORY

(76) Inventor: Khein-Seng Pua, No. 327, Site C 45400, Sekinchan, Selangor D.E. (MY)

( * ) Notice: Subject to any disclaimer, the term of this patent is extended or adjusted under 35 U.S.C. 154(b) by 0 days.

(21) Appl. No.: 09/576,235

(22) Filed: May 24, 2000

(51) Int. Cl.[7] .......................... G06F 13/00; H05K 7/00; H01R 13/642; H01R 9/09

(52) U.S. Cl. ...................................... 710/302; 361/685

(58) Field of Search ................................ 710/301, 302, 710/2, 8, 62, 74; 714/5, 7; 711/112, 115; 361/736, 684, 685; 439/928.1; 360/137; 713/300

(56) References Cited

U.S. PATENT DOCUMENTS

| | | | | |
|---|---|---|---|---|
| 5,515,515 | A | * | 5/1996 | Kennedy et al. |
| 5,604,873 | A | * | 2/1997 | Fite et al. |
| 6,295,565 | B1 | * | 9/2001 | Lee |

* cited by examiner

*Primary Examiner*—Gopal C. Ray
(74) *Attorney, Agent, or Firm*—Troxell Law Office PLLC

(57) ABSTRACT

The present invention is related to a hard discs body device for IDE interface & flash memory, there are clipping component, ceasing slide component and protecting unit on the corresponding location of the hard discs body, to make hard discs body install on interface socket, clipping component is flexible and can hold tightly, resist shaking, protecting unit can make installation faster and correctly, which also can prevent mistake and more convenient for upgrading.

7 Claims, 7 Drawing Sheets

INTERFACE OF HARD DISCS BODY DEVICE FOR HOT SWAP MEMORY

FIELD OF THE INVENTION

The present invention is related to an interface of hard discs body device, especially the interface of a standard hard discs that connect with hot swap interface. The present invention is a device to hot swap memory.

Usually we have to use proper instruments and equipment to deal with the working situation in which a large amount of data exits. Particularly on the high speed information expressway, different kind of work needs comparatively saving device; for example, the desk top outer users have to use hard discs and CD-R; the image workers need a device that has a mass storage and can be easily carried, like MO and ZIP. Furthermore, digital camera users need Compact Flash, Smart Media, and PCMCIA-ATA Card. Therefore; the exchanges of the data among different data saving devices become a regular work.

Nowadays, the memory like PCMCIA-ATA Card, Compact Flash Card or Smart Media are small and easy to be carried, so they are largely used in communication equipment, digital cameras, notebook computers, personal digital assistants, laptop computers, digital recorders and portable telephones. Since there is no proper interface in the PC, users have to transfer the data saved in the above products to the PC by means of extra devices.

In the market now, there is a PCMCIA (Personal Computer Memory Card International Association) to read the data in the memory when the data are transferred among data saving devices, however; in this way, users have to buy expensive equipment and the operation procedure is very complicated, that is, users have to transfer the ISA or PCI signals on a motherboard through a Host Bus Adapter into the Common Memory Mode signals of PCMCIA. One of the drawbacks of this system is the difficulty of the design, and the other one is, to communicate with the PC, the controller has to match up with the driver of the socket service and the card service. The worst drawback is when users set up the above equipment, they have to take the host apart, and then put the interface into the ISA or PCI socket, and reset the device driver of the operating system. All the above procedure is very complicated and cost much.

Some people use universal serial bus (USB) readers, which have to connect with controller to transfer the USB signals into ATA-IDE signals to be the interface of communicating with the PC. Others use parallel port to connect with reader to install driver to transfer the parallel port signals into data saving device signals. All the methods above will waste the interface and occupy the sockets of the computer. It not only needs expensive equipment but also very inconvenient for us to use.

Most of the popular desktop computers use parallel ports and USB to be the interface to communicate with the PC.

In view of the pressing demand of plugging the memory in the PC to transfer the data, and the standard hard discs interface can directly support to hot swap the memory, the inventor develops a hard discs body device for hot swapping interface by means of his long term accumulated experience on application and manufacture in that field and through continuous testing and improvement.

SUMMARY OF THE INVENTION

The primary object of the present invention of the hard discs body device for hot swap interface is the standard hard discs interface connects with the hot swap interface to control the loopback. The memory directly plugs in the hot swap interface to control the switch of the power and to supply the hard discs interface, hot swap interface to make the storage data readable.

The secondary object of the present invention of the hard discs body device for hot swap interface is the standard hard discs interface connects with hot swap interface, and directly install in the computer for directly plugging in the memory. This can economize the user of the space and save the cost.

The objects, characteristics and functions of the present invention are best described in detail in conjunction with the following examples and the accompanying drawings:

DETAILED DESCRIPTION OF THE INVENTION

Figure 1:
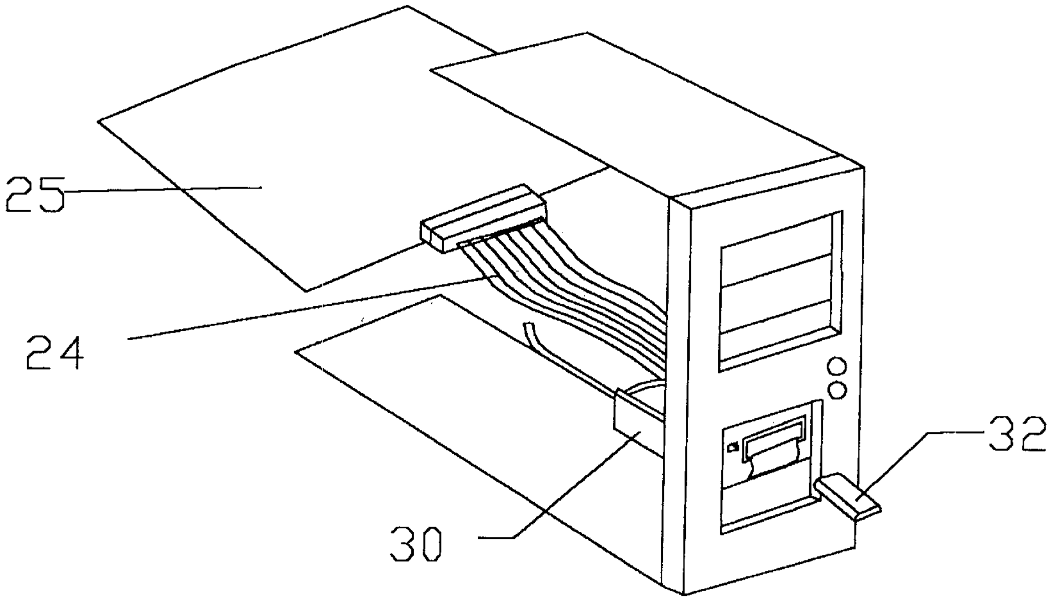
FIG. 1 is a diagram of the present invention being installed inside the computer.
Figure 2:
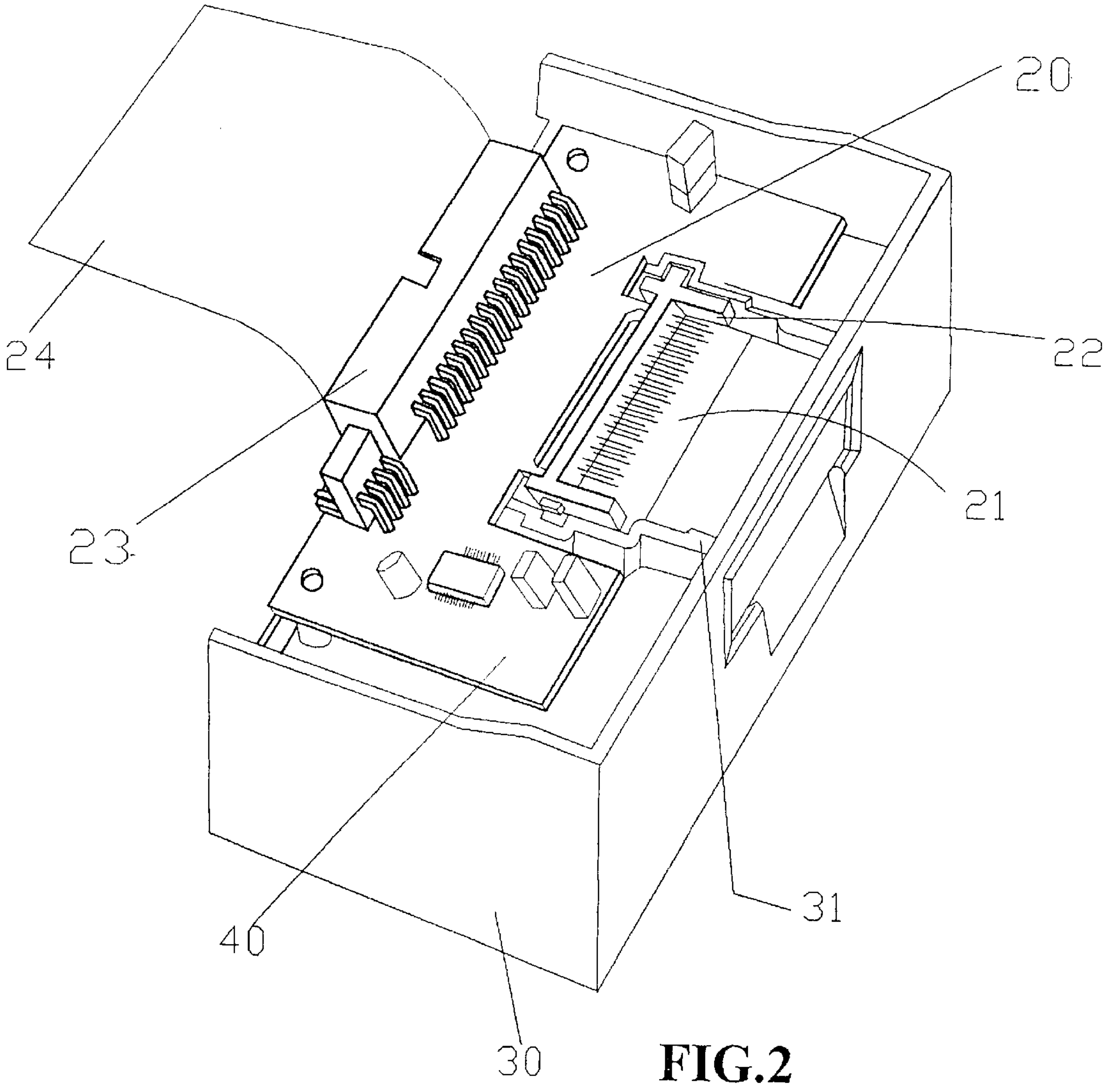
FIG. 2 is a diagram of the fabrication of the interface and reader of the present invention.
Figure 3:
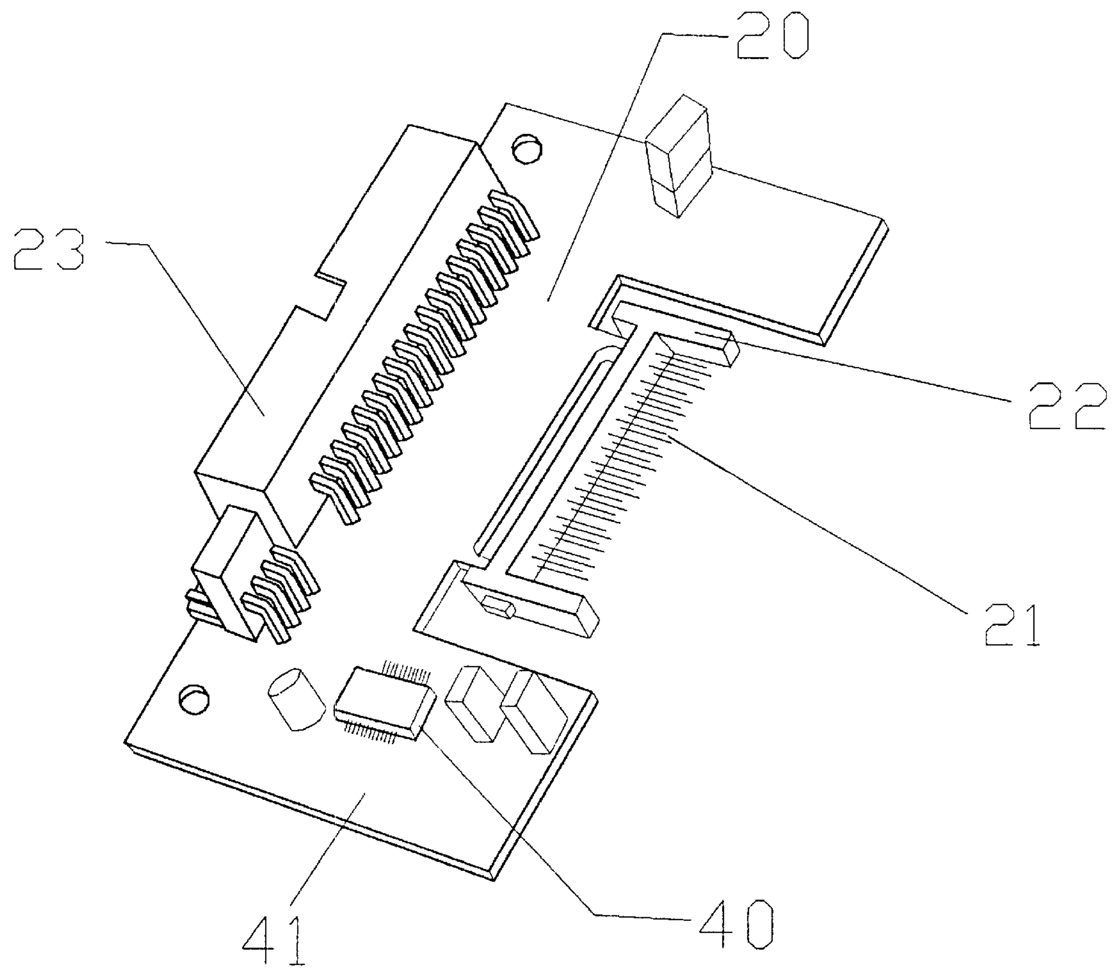
FIG. 3 is a diagram of the interface of the present invention.

As shown in FIG. 1 and FIG. 2, the present invention of a hard disc body device for hot swap interface, which consists a hot swap interface, a reader 30 and a control loopback 40.

On one side of the hot swap interface 20, as shown in FIGS. 1, 2, 3, and 4 are two lines of pins 21, which are paralleled and its number are decided. At the ends are two sets of detected pins 211, 211', 212 and 212'. Pin 211 and pin 212' do not link together; neither does pin 212 and pin 212'. Besides, there are two power pins 213 and 213' placed in the middle. The hot swap interface 20 has a concave socket 22 on the outside of the pin 21. On the other side of the hot swap interface 20 is a cable socket 23; one end of a bus 24 connects with the cable socket 23 and the other end connects with the standard hard discs interface 25.

Figure 5:
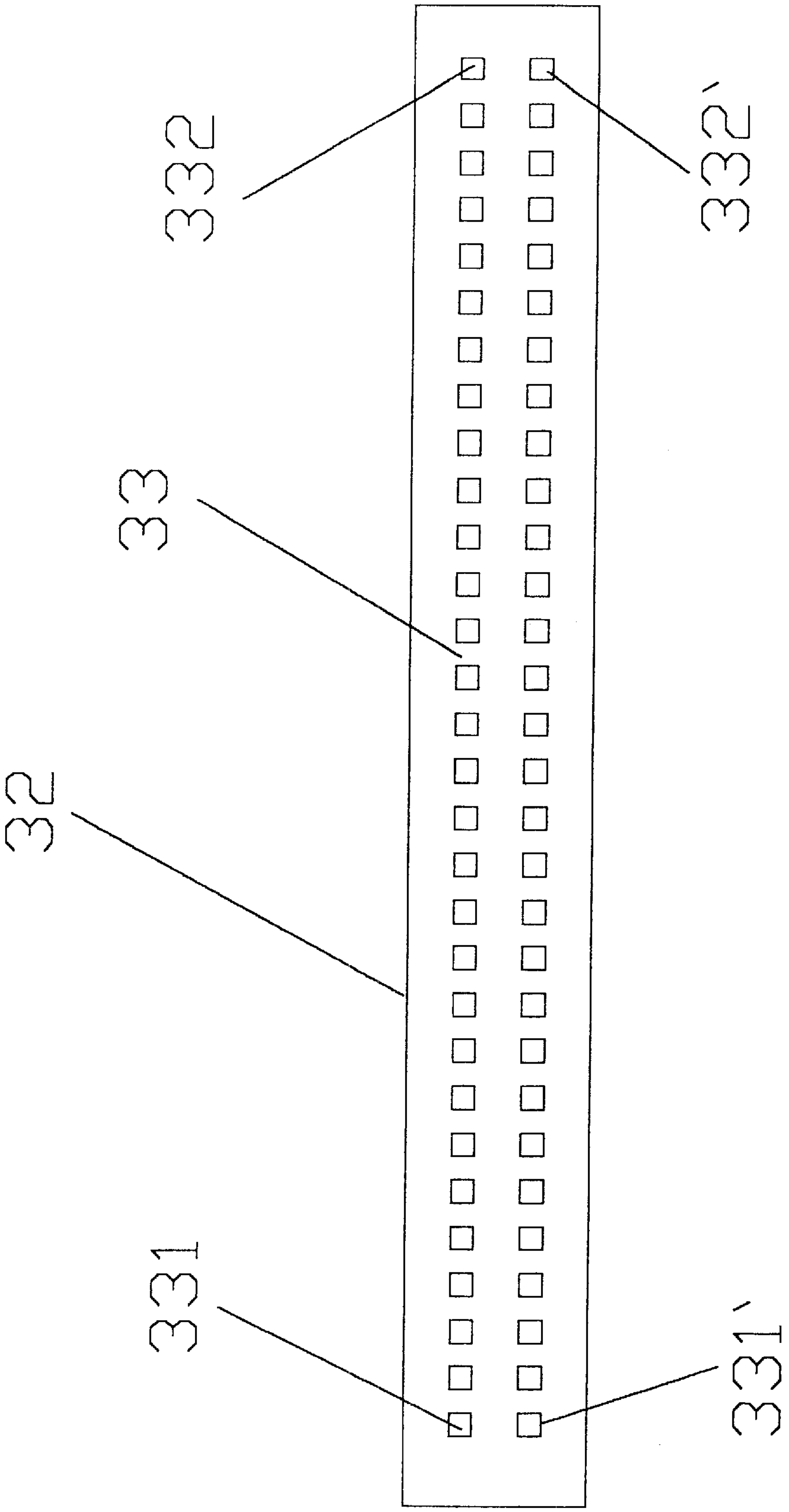
FIGS. 5 and 6 are diagrams of the allocation of the memory signal line of the present invention.

The reader 30, as shown in FIGS. 1, 2, and 5, has a housing for the hot swap interface 20. A socket 31 sets up at the corresponding place of socket 22 for memory 32 to fit in. The memory 32 has the same numbers of signal socket 33, which is corresponding to the pin 21 and they can fit to each other. The signal socket 33 has a CD1 signal socket 33 and a CD2 signal socket 332, which are corresponding to the detected pins 211 and 212. The signal socket 331 and 331' of the CD1 are connected, so are the signal socket 332 and 332' of the CD2.

The control loopback 40, as shown in FIGS. 3, 4, 5 and 6, is a PCB 41, which is placed on the side of the hot swap interface 20. Two guide lines 411 and 412 are paralleled on the PCB 41. Each one has an end to connect the detected pin 211 and pin 212. The other ends of the guide line 411 and 412 connect with the gateway 421 of the operation loopback 42 and an anti gateway 422 connects with the gateway 421. Another anti gateway 423 connects the anti gateway 422. The anti gateway 423 connects with the transistor 431 of a switch loopback 43. A guide line 44 of the switch loopback connects the power pin 213 and 213', in the mean time, the power pin 213 and 213' connectc with the hot swap interface 20 and connect with the standard hard discs interface 25 by means of the cable socket 23. In this case, the hot swap interface 20, the standard hard discs interface 25 and the memory 32 are connected structure. Another two electric current restricted components 45 and 46, corresponding to the guidelines 411 and 412 is located between the detected pins 211, 212 and the gateway 421. The electric current restricted components 45 and 46 form a ground connection. The electric current restricted components 45 and 46 are resistances that have high resistiveness saled in the market.

Figure 4:
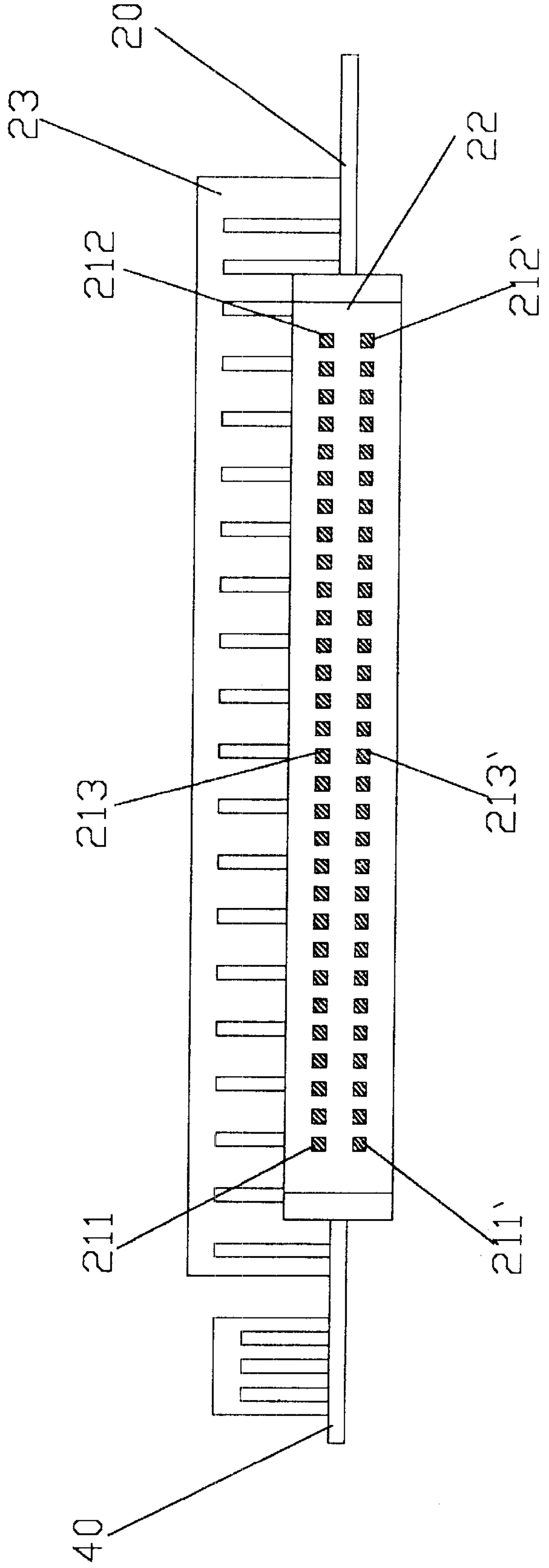
FIG. 4 is a diagram of the allocation of the hard discs signal line of the present invention.

According to the above structure, as shown in FIG. 2, 4 and 5, the standard hard discs interface 25 has 40 pins signal lines. The standard hard discs interface connects with cable slot 23 by means of the bus 24 to form a connected pins 21, which is corresponding to the hot swap interface 24. The hot swap interface has multi pins, which are over 40 pins signal lines. (The present invention chooses to use the standard equipment of 50 pins, 68 pins are fine, too). Among the rest pins of the pins 21 of the host swap interface 20, the detected pin 211 correspondingly connects the guidelines 411 and 412, and the power pins 213 and 213' correspondingly connect with the ATA-IDE addressing mode signal of the memory 32.

To address the memory 32, as shown in FIG. 1 and FIG. 5, the insert 31 of the reader 30 has not been correspondingly connected with the memory 32. Although the power pins 213 and 213', which is corresponding to the No. 13 and No. 38 signal pins, are ground connecting, the detected pins 211 and 211' of the hot swap interface 20 are not connected, neither are pins 212 and 212'. The reader 30 correspondingly connects power pins 213,213' and ground connection (0 pressure). The reader 30 is in save mode; that is, it is not under electric conducted circumstance.

Figure 6:
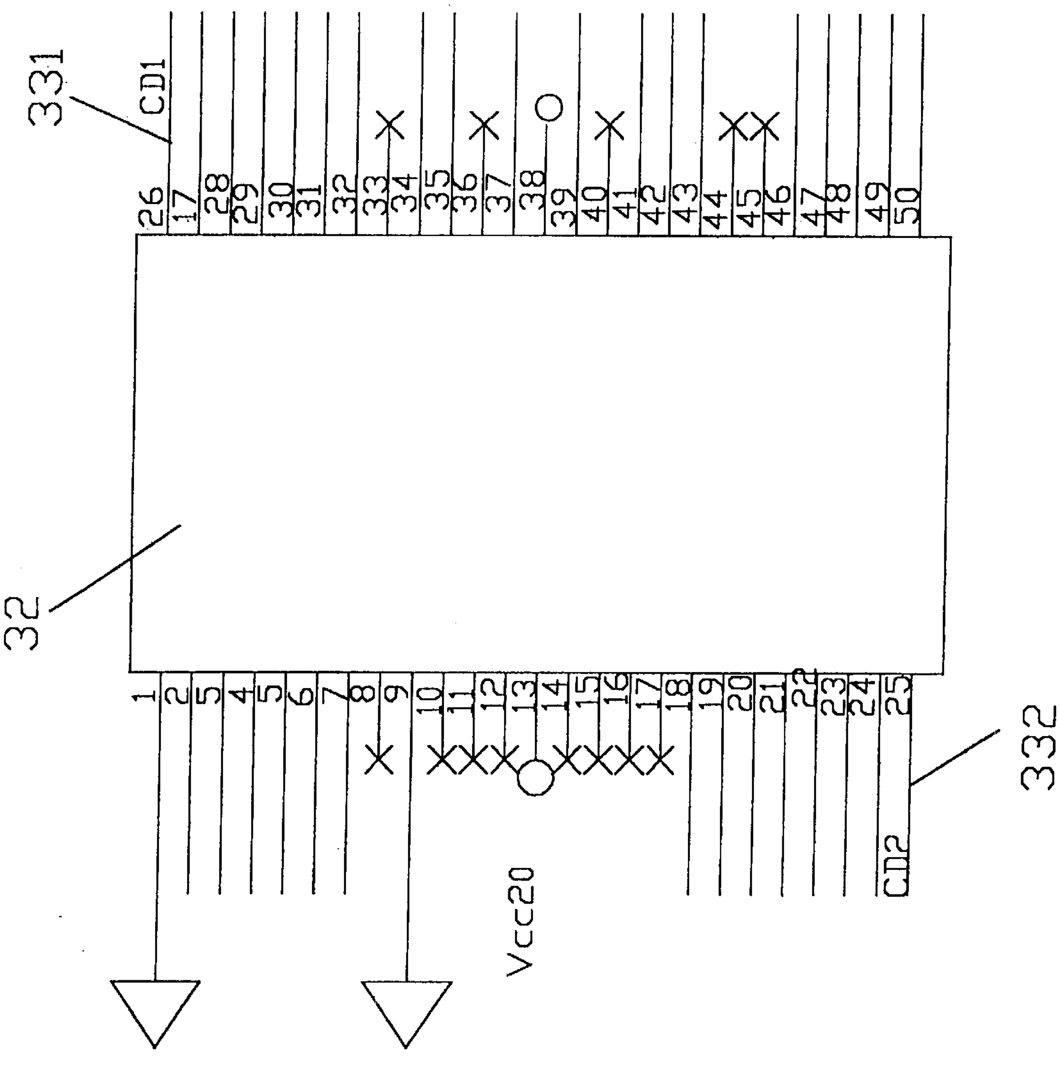
Figure 7:
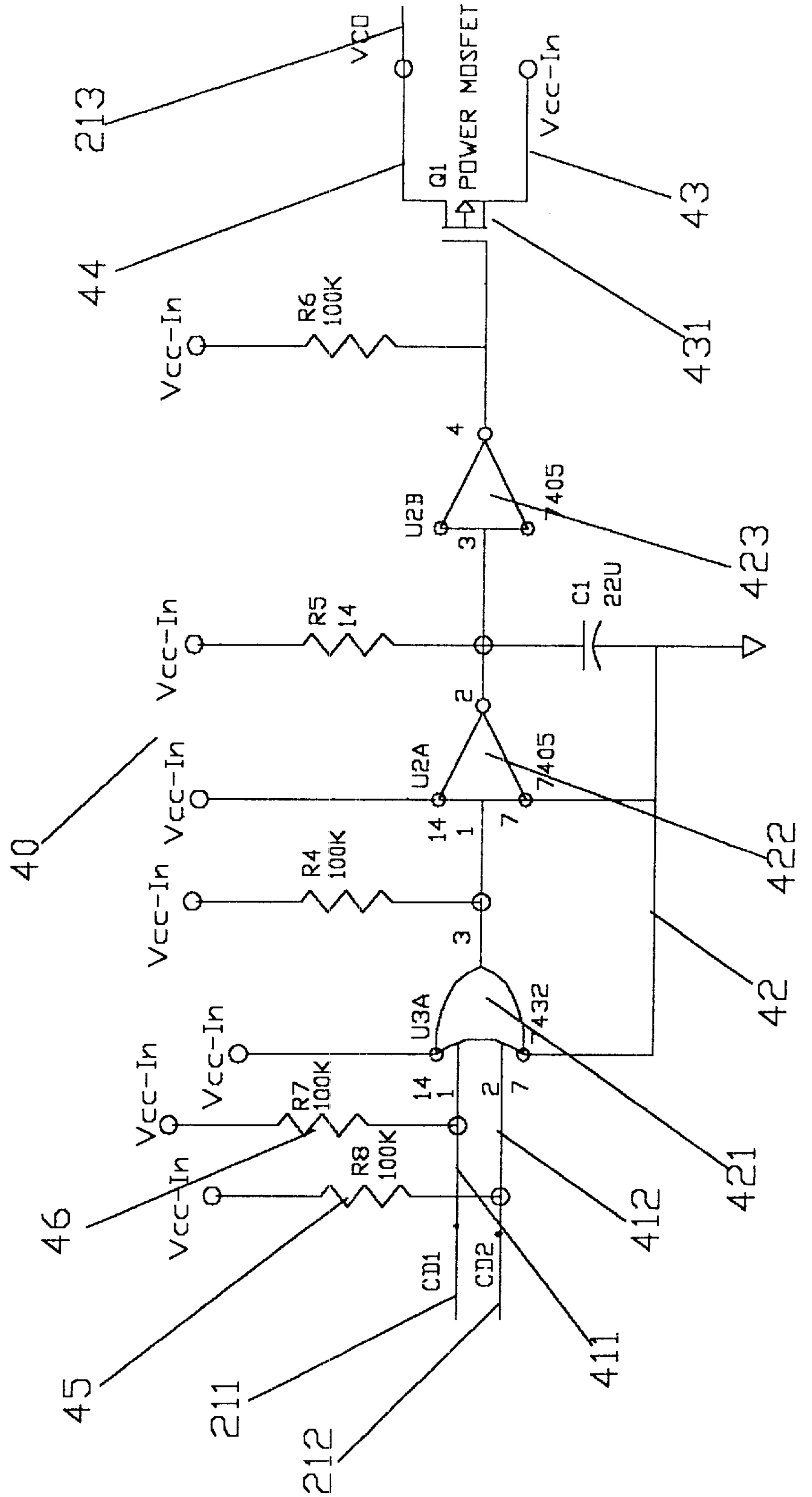
FIG. 7 is a circuit design chart of the control loopback of the present invention.

When in use, the memory 32 inserts in the slot 31 of the reader 30 (as shown in FIGS. 1, 5 and 6). The CD1 signal slot 331 and CD2 signal slot 332 connect with the detected pins 212 and 212, and also connect with the signal slot 331' through signal slot 331 of the CD2. So that the signal slot 331, signal slot 331', detected pin 211 and detected pin 211' are connected. In the meantime, detected pin 212 and 212' are connected. For all of this, the signal slot 331 of the CD1 and the signal slot 332 of the CD2 can connect to electricity by grounding.

In the present invention, the signal slot 331 of the CD1 and the signal slot 332 of the CD2 are ground connected at the same time by connecting the detected 211, 211 of the hot swat interface 20 and the corresponding guide line 411, 412 of PCB 41. Turn on the power, output signals (0 or low) through gateway 421 of the operational loopback 42 and then use the anti gateway 422 to connect the gateway 423 to postpone to proper time to output 0 or low signals. Then boot the transistor 44 to form an open statement. In order to read the storage data of the memory 32 for the users, the guide line 45 connect with power and connects the pins 213 and pins 213' to supply power to the hot swap interface 20 and the standard hot discs interface 25.

When users pull out the memory 32 or when the socket 31 of the reader 30 has not connected to the memory 32, as shown in FIGS. 5 and 6, the detected pin 211 211' 212 and 212' are disconnected and this form a specific signal (signal 1). The specific signals (signal 1) is re-operated by the operational loopback 42 or gateway 421 and output a specific signal (signal 1) to keep the transistor 44 in a disconnected condition. The switch loopback 43 and the standard hard discs interface 25 are disconnected and there is no power to supply the reader 30, so that the switch loopback 43 connects with the reader 30 in a disconnected and power saved condition.

It can be clearly understood from the above description, the present invention use the hot swap interface 20 to detect whether the memory 32 insert in the reader 30 or not to output signals (0, low or 1). The signals are received by the gateway 421, anti gateway 422 and anti gateway 423 of the operational loopback 42. And the memory 32 inserts in or not is known by reconfirming and re-operating. As a result of this, the switch loopback 43 turns on off at an appropriate time, so that the memory 32 can be inserted in the reader 30 to connect the power or pulled out to disconnect, and becomes a power saved condition. That is, the memory 32 can hot swap to support the hard disc interface 25 to get to the hot swap function.

When users insert the memory 32 in the reader 30 slantwisely, the CD1 signal 331 and CD2 signal 332 of the memory 32 female joint with the detected pins 211 and 212 or the signal slot 331 and signal slot 332' female joint with detected pin 211' and 212' may be in a bad connection. The detected pins 211 and 212 are in a disconnected condition, as shown in FIGS. 5 and 6, at this time, the present invention can connect the guide line 411 and 412 by the parallel detected pins 211 and 212, so the either detected pins 211 or 212 is in disconnected, a specific signal (1 signal) comes out correspondingly, and the gateway 421 produces a signal after it receives the signal. The transistor 44 of the switch loopback 43 is disconnected and does not move. In this case, users have to insert the memory 32 correctly to use and it must have the function to prevent idleness.

The guideline 411 and 412 connect power and transfer to the anti gateway 422 and 423 through the gateway 421. By the inner circuit design collocates electric capacity to form a registered function. The registered function can delay the set up time and to produce a signal to delay the boot of the transistor 44 to lower the rapidly increasing power supply. So that the power supplies can be stable and normal to protect the inner loopback from the harm of overlarge and suddenly happened electric current. It not only prevents the power from disconnecting but also can confirm the memory 32 can insert correctly.

The standard hard discs interface 25 of the present invention connects with the hot swap interface 20. The memory 32 can directly insert in the pin 21 of the hot swap interface 20 by the control loopback to control the supply of the power. The present invention uses low price equipment to insert memory 32 in hot swap way. So, users do not have to use expensive equipment, such as pcmcia, driver or controller in complicated procedure.

What is described above is only a better example of the present invention of the memory hot swap of the hard discs interface device but cannot limit the scope of putting the present invention into practice, to wit, the relative changes and modifications conducted according to the claims of the present invention shall remain within the scope covered by the said claims. The hot swap interface connects with control loopback so that the standard hard discs interface; the reader and the hot swap interface are connected. The memory can be directly inserted in or pulled out to switch the supply of power. It cost less and it is easy to be assembled. Besides, the memory is suitable to be used for hot swap.

What is claimed is:

1. A hard discs body device for hot swapping memory comprising a hot swap interface having a first side connected with a standard hard discs interface, and a second side with a predetermined number of pins to connect a memory;

a control loopback having a predetermined number of guidelines connected to pins of the hot swap interface, and to an operational loopback connected with a switch loopback, which is connected with the hot swap interface and a standard hard discs interface, whereby the hot swap interface and the operational loopback produce specific signals to turn on or cut off the switch loopback, to supply the power to the hot swap interface and the standard hard discs interface.

2. The hard discs body device for hot swapping memory of claim 1 wherein a standard hard disc interface is connected to a reader, with memory female joints of the reader engaging the pins of the hot swap interface.

3. The hard discs body device for hot swapping memory of claim 1 wherein the control loopback connects with guide lines of the operational loopback which is correspondingly connected to a circuit confined element which is ground connected.

4. The hard discs body device for hot swapping memory of claim 3 wherein the circuit-confined element is a resistance.

5. The hard discs body device for hot swapping memory of claim 1 wherein one side of a gateway of the operational loopback connects with one of the guidelines, and another side of the gateway is series connected to two anti gateways and then to the switch loopback.

6. The hard discs body device for hot swapping memory of claim 5 wherein the switch loopback is connected to a transistor which receives the signals from the gateway to be connected or disconnected.

7. The hard discs body device for hot swapping memory of claim 1 wherein the switch loopback is connected to a transistor which receives the signals from to be connected or disconnected.

* * * * *